United States Patent
Conrad et al.

(10) Patent No.: US 8,873,128 B2
(45) Date of Patent: Oct. 28, 2014

(54) REDUCTION OF THE DYNAMIC DEFORMATION OF TRANSLATIONAL MIRRORS USING INERTIAL MASSES

(75) Inventors: Holger Conrad, Dresden (DE); Thomas Grasshoff, Dresden (DE); Denis Jung, Dresden (DE); Thilo Sandner, Dresden (DE)

(73) Assignees: Fraunhofer-Gesellschaft zur Foerderung der Angewandten Forschung E.V., Munich (DE); Technische Universitaet Dresden, Dresden (DE)

( * ) Notice: Subject to any disclaimer, the term of this patent is extended or adjusted under 35 U.S.C. 154(b) by 306 days.

(21) Appl. No.: 13/377,667

(22) PCT Filed: Jul. 6, 2010

(86) PCT No.: PCT/DE2010/000805
§ 371 (c)(1),
(2), (4) Date: Dec. 12, 2011

(87) PCT Pub. No.: WO2011/003404
PCT Pub. Date: Jan. 13, 2011

(65) Prior Publication Data
US 2012/0099175 A1      Apr. 26, 2012

(30) Foreign Application Priority Data
Jul. 7, 2009    (DE) .......................... 10 2009 033 191

(51) Int. Cl.
*G02B 26/00*      (2006.01)
*G02B 26/10*      (2006.01)

(52) U.S. Cl.
USPC ..................... 359/290; 359/223.1; 359/224.1; 359/224.2; 359/225.1; 359/226.1; 359/226.2; 359/291; 359/292; 359/295; 359/298

(58) Field of Classification Search
USPC .................... 359/223.1–226.2, 290–295, 298
See application file for complete search history.

(56) References Cited

U.S. PATENT DOCUMENTS

| 6,876,124 | B1 | 4/2005 | Lin et al. |
| 7,190,508 | B2 * | 3/2007 | Yang .............................. 359/291 |
| 2006/0038103 | A1 | 2/2006 | Helmbrecht .............. 248/346.01 |
| 2008/0106169 | A1 | 5/2008 | Nagara ......................... 310/309 |
| 2008/0239446 | A1 | 10/2008 | Jung et al. ..................... 359/225 |
| 2008/0284279 | A1 * | 11/2008 | Obi .............................. 359/223 |

FOREIGN PATENT DOCUMENTS

| DE | 10226305 | 10/2003 |
| DE | 102004030803 | 1/2006 |
| EP | 1754683 | 2/2007 |
| JP | 2003075738 | 3/2003 |
| JP | 2005-266074 | 9/2005 |
| WO | 97/45702 | 12/1997 |
| WO | 2008/089786 | 7/2008 |
| WO | 2009/044360 | 4/2009 |

* cited by examiner

*Primary Examiner* — Evelyn A. Lester
(74) *Attorney, Agent, or Firm* — Jacobson Holman, PLLC (57) ABSTRACT

A micromechanical mirror arrangement comprising a mirror plate (1) which forms a translation mirror, which is connected via at least one holding element (2), preferably two or more holding elements, to a frame structure (3) and is movable in translation relative to this frame structure, characterized in that the connection region (4) of at least one holding element (2), preferably of all holding elements, with the mirror plate (1) is arranged inwardly offset, viewed from the outer margin (5) of the mirror plate toward to the center (6) of the mirror plate.

28 Claims, 10 Drawing Sheets

Fig. 5 (top)    Fig. 6 (bottom)

REDUCTION OF THE DYNAMIC DEFORMATION OF TRANSLATIONAL MIRRORS USING INERTIAL MASSES

This is a national stage of PCT/DE10/000,805 filed Jul. 6, 2010 and published in German, which claims the priority of German number 10 2009 033 191.3 filed Jul. 7, 2009, hereby incorporated by reference.

The present invention relates to micromechanical mirror arrangements using translation mirrors in accordance with the preamble of the independent claims. The present invention furthermore relates to methods for operating such micromechanical mirror arrangements and to their use.

Micromechanically produced translation mirrors are used, for example, as phase-shifting components in Fourier transform spectrometers (FTs) inter alia for the infrared wavelength range (FTIR). The use of resonantly driven and electrostatically driven translation mirrors as acceleration sensors is furthermore known.

Figure 1:
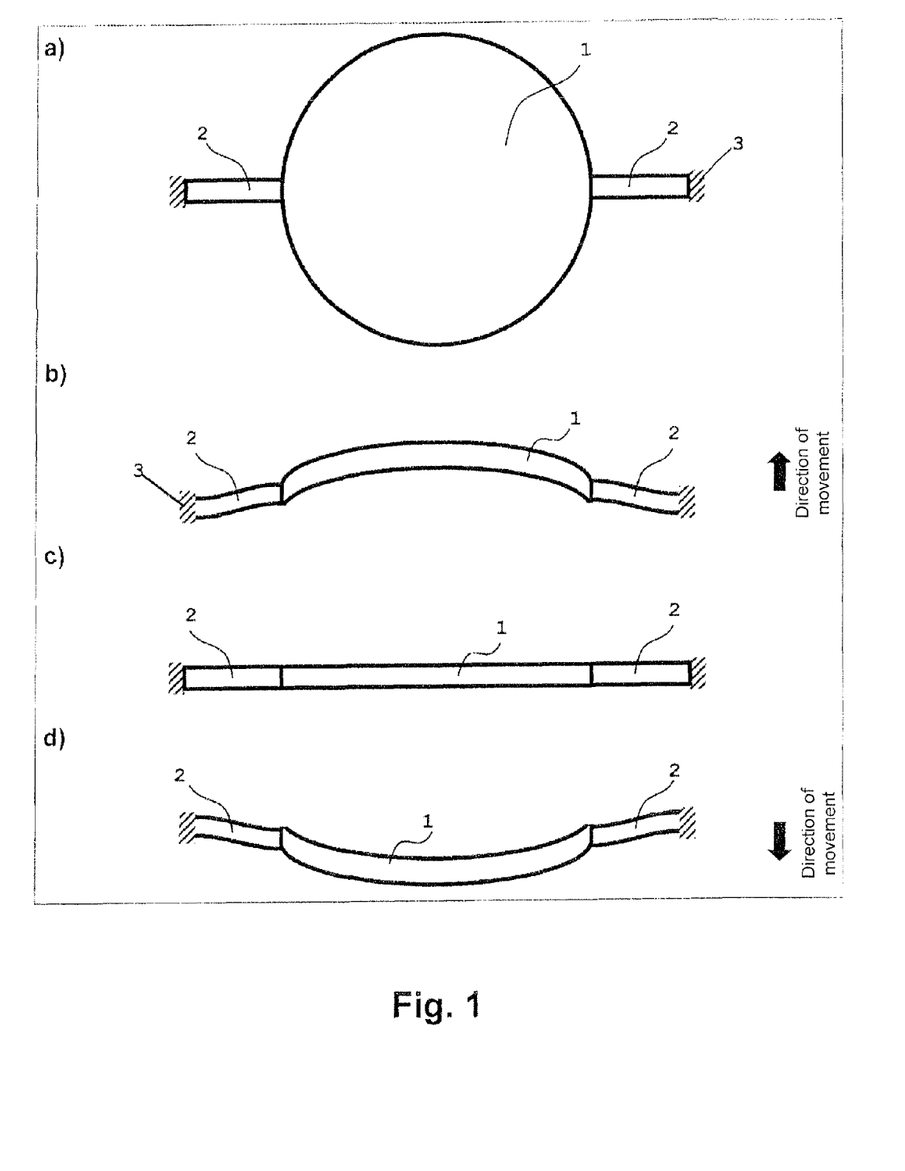
FIG. 1 a micromechanical mirror arrangement in accordance with the prior art.

FIG. 1a) shows the basic design of such a translation mirror in a plan view of the translation mirror plane. A mirror plate 1 forming the translation mirror is connected to a frame structure 3 via a plurality of holding elements 2 (here: two), with the mirror plate 1 then being movable in translation relative to the fixed frame structure 3 perpendicular to the plane shown. The two holding elements 2 will alternatively also be called joints or hinges in the following; they can be realized, for example, as bending beams, as meandering springs or as a pantographic suspension.

If the mirror plate 1 is in its position of rest (cf. FIG. 1c; FIGS. 1b to 1d show cross-sections through the mirror arrangement shown in FIG. 1a perpendicular to the translation mirror plane or to the plane shown in FIG. 1a, with the cross-sectional plane extending through the longitudinal axis of the holding elements 2, no inertial forces act on the mirror plate 1. The mirror plate is accordingly planar. If the mirror plate 1 now moves out of the position of rest due to a drive pulse having a component perpendicular to the translation mirror plane, the elastomechanical reaction forces of the holding elements 2 counter the moved mirror mass. These reaction forces result in deformations of the mirror plate (FIGS. 1b and 1d). At the reversal point of the movement, i.e. when the kinetic energy has been completely converted into deformation energy, the reaction forces become maximum. On an upward movement of the frame structure 3 (together with the mirror plate 1 and the holding elements 2), the mirror plate 1 is moved downwardly relative to the frame structure; a key-shaped deformation of the mirror plate 1 thus results through the inertial forces of the mirror plate 1 (FIG. 1d). If the mirror plate 1 is moved in the opposite direction (upwardly), the inertial forces thus result in a helmet-shaped deformation of the mirror plate 1 (FIG. 1b).

The thickness of the mirror plate can now be increased, and thus the structure of the mirror plate stiffened, to reduce the dynamic deformation of micromirrors moved in translation. However, a thickness increase is not unlimitedly possible in particular for micromechanical mirror plates. On the one hand, the manufacturability of the microcomponent with an enlarged mirror plate thickness can only be ensured with an increased technological effort due to technological constraints; on the other hand, the thickness of a mirror plate simultaneously also increases its mass, which has a negative effect on the shock resistance of the microcomponent. In addition, flexibly designed holding elements or holding structures (for example beam springs, torsion rods or torsion sections) are also undesirably stiffened when they have the same structural height or thickness as that of the mirror plate. Stiffened holding elements and/or an increased mass of the mirror plate moreover effect a change in the mechanical eigenfrequencies of the translational vibration in resonantly operated micromirrors.

Starting from the prior art, it is therefore the object of the present invention to provide micromechanically mirror arrangements having translation mirrors in which inertia-induced dynamic deformations of the mirror plate moved in translation are reduced.

The reduction of such inertial forces which are aligned with the direction of movement and which deform (e.g. warp) mirror plates known from the prior art is important, for example, on the use of a mirror plate in a Fourier transform spectrometer since the dynamic deformation of the phase-shifting mirror plate causes an increase in the beam divergence of the interferometer as a consequence of which a reduction of the spectral resolution of the Fourier transform spectrometer results. However, a reduction of the inertia-induced dynamic deformations of the mirror plate is also very generally desired (for example also in actuators in which the mirror plate represents the deflecting element) since the utilization of translation mirrors in adaptive optics systems results in aberrations of the reflected light when there is a dynamic deformation of the mirror plate.

The present invention will first be described generally in the following and then with reference to individual embodiments. In this respect, the features of the present invention realized in combination with one another in an embodiment do not have to be realized in exactly the shown combination, but can rather also be realized in other combinations within the framework of the protective scope realized by the claims. Individual ones of the shown features of an embodiment can in particular also be omitted or can be combined in another manner with further individual features of the shown embodiment or of other embodiments.

Within the framework of the present invention, a center (e.g. a mirror plate or also an inertial element) is understood as a geometrical center of the corresponding element (for example of a circular mirror plate having point-symmetrical projections) and/or as a center of mass of the corresponding element (that is the center of gravity of the element). A mirror plate used in a mirror arrangement in accordance with the invention can as a rule in particular be shaped symmetrically (e.g. point-symmetrically to the center); it can, however, also be a mirror plate shaped irregularly or in any desired manner. The mirror plate is in this respect understood as the total body which is connected to the frame structure via the holding elements, that is, it is deflectable in translation relative to the frame structure. The term of a mirror plate or of a translation mirror in particular thus not only includes the base structure which is of a regular shape as a rule (e.g. a circular or rectangular structure), but also the projecting inertial elements attached to such a base structure.

In this respect, such a mirror plate can have a single-layer or multi-layer design; it can consist of a single material or comprise a plurality of individual sections of different materials. The term of a mirror plate thus includes all the sections of a mirror body of any desired shape which are present and connected to one another in the plane of the plate and which can be deflected in translation relative to the frame structure (and are restricted in their movement in translation relative to the frame structure by the holding elements).

If not otherwise stated in the following, the point of view used in the individual embodiments or in the general description of the invention always relates to the translation mirror plane or to the position of the translation mirror (or of the mirror plate) in its position of rest. If, for example, a mean distance of the outer margin of the mirror plate from its center is spoken of, all these parameters are to be determined in the translation mirror plane or by a parallel projection perpendicular to this translation mirror plane (which as a rule corresponds to the plane of the drawing in the Figures) and with respect to this translation mirror plane.

The basic idea of the present invention is the reduction of the inertia-induced deformation with the aid of additional inertial masses (in the following also called sections close to the outer margin and/or inertial elements of the mirror plate) fastened or projecting beyond the margin of the base structure of the mirror plate (in the following alternatively also called a section of the mirror plate adjacent to the center of the mirror plate and/or close to the center).

In accordance with the invention, the inertial forces first act on these additionally attached sections close to the outer margin or on these inertial elements of the mirror plate in the same direction as on the section of the mirror plate close to the center. Since, however, the connection region between the holding elements (for example: joints or hinges) and the mirror plate is arranged inwardly offset, that is, it is attached directly in the marginal region of the section of the mirror plate close to the center, the inertial forces of the sections closed to the outer margin or of the inertial elements result in torques in the region of the named connection regions, that is, at the margin of the section of the mirror plate close to the center. These torques which are coupled in induce additional bending moments in the mirror plate which counter the bending moments of the inertial masses of the region of the mirror plate close to the center. The inertia-induced dynamic deformation of the mirror plate at the center or at the section close to the center is thereby reduced. The region close to the center is thus pulled straight.

To realize these physical relationships, the connection region of the holding elements with the mirror plate can be arranged inwardly offset viewed from the outer margin of the mirror plate toward the center of the mirror plate. The aspect in this respect relates, as described above, to the translation mirror plane or position of rest.

The mean distance of the outer margin of the mirror plate from the center of the mirror plate can be larger than the spacing of the connection regions from this center. (The "connection regions" are in this respect, here as in the other configurations, always the fastening locations of the holding elements at the mirror plate).

The mirror plate can have a plurality of additional inertial elements which are preferably arranged point-symmetrically to their center and which are arranged in a projecting manner, viewed from the center of the mirror plate to the outside, with respect to the holding elements and/or to their already described connection regions.

The mirror plate can have a plurality of inertial elements which are preferably arranged point-symmetrically to the center of the mirror plate such that the perpendicular projection of the center of the inertial elements onto a straight line running through the center of the mirror plate comes to lie further away from the center of the mirror plate than the perpendicular projection of the already described connection regions on this straight line. Such a projection is a projection in the translation mirror plane.

In accordance with the invention, an arrangement of inertial masses or inertial elements can thus be realized outside the actually utilized optical surface of the mirror plate moved in translation such that the moments or forces coupled into the mirror plate by the mechanical inertia of the additional masses counter the inertia-induced dynamic deformations of the mirror plate and compensate them. The integration of the additional masses can take place at the outer margin of the section close to the center or of the base structure of the mirror plate, i.e. outside the actually utilized mirror surface of a mirror plate movable in translation. In this respect, as described in more detail in the following, the balancing masses, that is, the additional masses, can be spatially separated from the mirror mass by further structures (e.g. via frame elements).

It is thus possible that the actually optically utilized surface of the mirror element is bounded by the additional masses or inertial elements.

It is, however, also possible that the additional masses or the inertial elements have a mirror-coated layer and are equally optically utilized.

The micromechanical mirror arrangement in accordance with the invention can be used for resonant or non-resonantly vibrating translation mirrors, with the translation mirrors being able to be driven electrostatically, electromagnetically, piezoelectrically, piezomagnetically, electrostrictively, magnetostrictively, thermally or pneumatically.

For the region close to the center (base structure) of the mirror plate, a rectangular contour, a round contour or an elliptical contour can be realized (in conjunction with the holding elements attached in this inner region of the mirror plate and the inertial elements attached outside this internal region). The inertial elements can be shaped as desired or project in any desired shape.

The inertial elements can be connected to one another via inertial element holding elements or to the inner section or the region close to the center of the mirror plate. Different types of continuous or discrete holding elements can be used for the inertial element holding elements and for the above-described holding elements for connecting the translation mirror to the frame structure. For example free contours, beam springs, meandering spring elements or also pantograhic suspensions. The skilled person is familiar with how such holding elements can be made in detail.

On the connection of the inertial elements to the section of the mirror plate close to the center via separate frame elements, such frame elements can be designed as round frame structures or ring structures or also as polygonal frame structures or ring structures which are then fastened by a plurality of inner and outer connection pieces to the inner section of the mirror plate and/or to the inertial elements.

In accordance with the invention, different structure heights (seen perpendicular to the translation mirror plane) can be realized for the individual elements of the mirror arrangement. The realization of the mirror plate can be carried out in one layer or in multiple layers, with or without tensioned layers, with or without rear side or front side stiffening structures and/or with different combinations of the aforesaid elements. This will also be described in detail in the following.

The mirror plate 1 can be realized in the form of lamella-like grid components in which preferably bar-shaped structures have laterally projecting grid fingers. The inertial elements themselves can also be made as a lamella-like grid.

In accordance with the invention, the micromechanical mirror arrangement can be installed in a Fourier transform spectrometer, an interferometer, a lamella grid interferometer, a confocal microscope, an optical path length modulator or an acceleration sensor.

The above-described embodiments of the present invention as well as further modifications of these embodiments will be described in the following with reference to individual embodiments.

There are shown.

Figure 2:
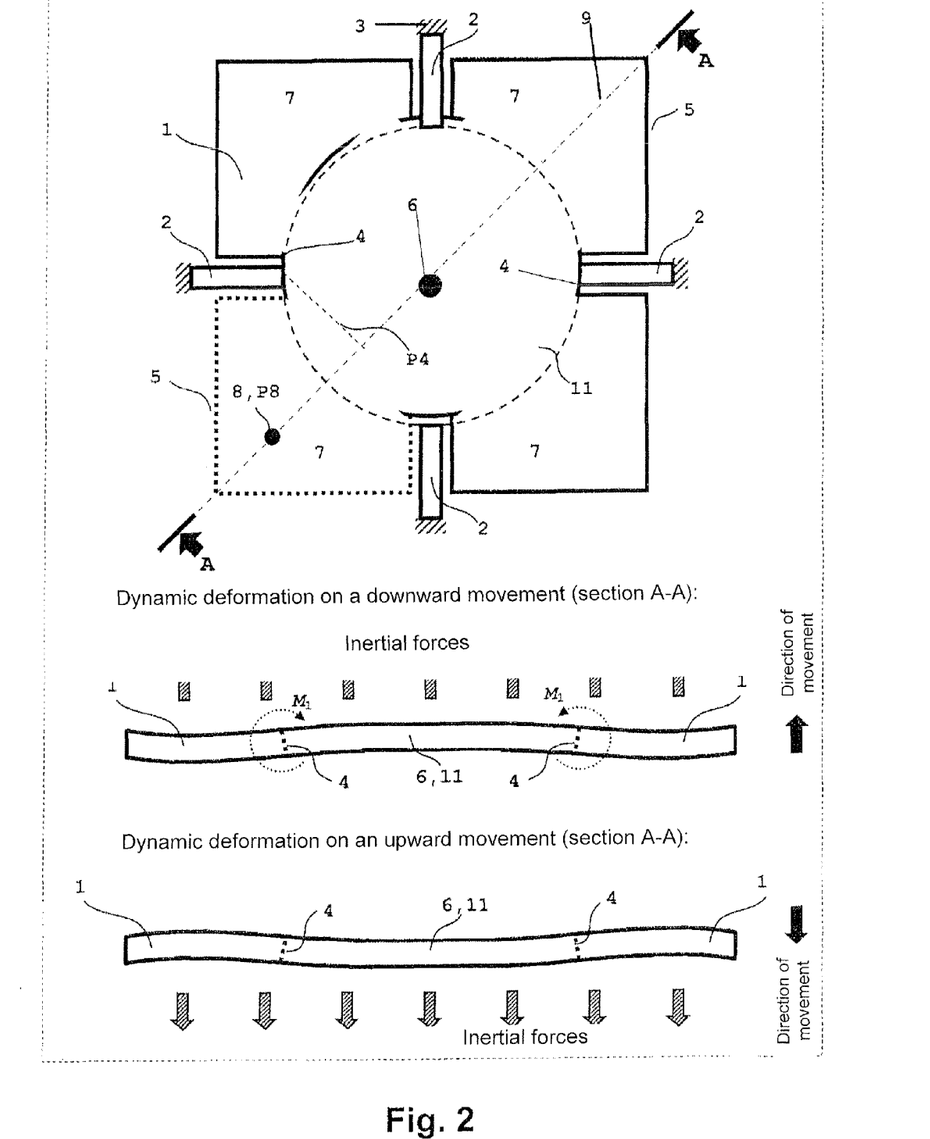
FIG. 2 a first embodiment for the present invention.

FIG. 2 shows a first micromechanical mirror arrangement in accordance with the invention. The mirror plate 1 in this respect forms a translation mirror which is connected via four holding elements 2 arranged symmetrically to the origin or center 6 of the mirror plate 1 to a frame structure 3. As described above, on a movement of the frame structure 3 perpendicular to the translation mirror plane shown at the top in FIG. 2, the mirror plate 1 is pivotally connected by these holding elements relative to the frame structure 3 in a direction perpendicular to the translation mirror plane (cf. in FIG. 2, center and bottom, the cross-sections perpendicular to the translation mirror plane).

The mirror plate 1 comprises a section 11 close to the center which is formed in the shape of a round plate arranged concentrically about the center 6 of the mirror plate 1. At the outer margin of this round section 11 of the mirror plate 1 close to the center (this margin is drawn with dashed lines), the four holding elements 2 in the form of beam springs are arranged symmetrically to the center 6 of the mirror plate 1 distributed at intervals of 90° in each case viewed over the periphery of this round central section 11 and are connected to the section 11 or to the mirror plate 1.

The mirror plate 1 has a respective inertial element 7 between two adjacent holding elements 2; a total of four inertial elements 7 are thus formed as outwardly standing part sections of the mirror plate 1. These four inertial elements 7 are made, shaped and arranged so that a point-symmetrical arrangement to the center 6 of the mirror plate 1 is present. The inertial elements 7 are also arranged at the outer margin (dashed) of the section 11 close to the center or are connected thereto in the form of a single-piece design.

The outer margin 5 of the mirror plate 1 (comprising the inertial elements 7 and the section 11 close to the center) is arranged and formed further away from the center 6 of the mirror plate 1 by the inertial elements 7 which are arranged projecting outwardly with respect to the inner section 11 of the mirror plate 1 close to the center or by their finite surface extent than the connection regions 4 (or the contact point 4) between the ends of the holding elements 2 close to the center and the mirror plate 1 or the section 11 of this mirror plate 1 close to the center.

The four inertial elements 7 thus project out with respect to the position of the connection regions 4 between the holding elements 2 and the mirror plate 1 and from the center 6 of the mirror plate 1, viewed from the outside. The projecting or protruding inertial elements 7 are in this respect fastened to the section 11 close to the center offset by 45° to the holding elements 2.

The configuration shown in accordance with the invention of a micromechanical mirror arrangement can thus be described as follows:

The connection regions 4 of the holding elements 2 to the mirror plate 1 are arranged inwardly offset, viewed from the outer margin 5 of the mirror plate 1 toward the center 6 of the mirror plate 1.

If the mean distance E (not shown here, cf. FIG. 3 in which this distance is shown sectionally) of the outer margin 5 of the mirror plate 1 from its center 6 is formed over the periphery of the mirror plate 1 (that is of the inner section 11 together with the projecting inertial elements 7), then this mean distance E is larger than the spacing of the connection regions 4 between the holding elements 2 and the mirror plate 1 from this center 6.

The mirror plate 1 has four inertial elements 7 which are arranged point-symmetrically to its center 6 and which are arranged in an outwardly projecting manner with respect to the holding elements 2 or their connection regions 4 to the mirror plate 1, viewed from the center 6 of the mirror plate 1.

There is thus a straight line 9 which runs through the center 6 of the mirror plate (it is a diagonal through the shown point-symmetrical arrangement in FIG. 2), with the following applying to perpendicular projections in the translation mirror plane onto this straight line:

The perpendicular projections P8 of the centers 8 of the inertial elements 7 (only the center 8 of the inertial element 7 is shown at the bottom left here) are incident onto the straight line 9 such that they come to lie further away from the center 6 of the mirror plate 1 than the perpendicular front projections P4 of the connection regions 4 of the holding elements 2 with the mirror plate 1 (here likewise only shown for one holding element 2—left in the image here).

FIG. 2 shows, in the bottom half, the resulting dynamic deformation on a downward movement of the frame structure (top) and on an upward movement of the frame structure (bottom). As described above, the inertial forces act on the inertial elements 7 in the same direction as on the inner section 11 of the mirror plate 1. Since, however, the holding elements 2 are directly attached to the margin of the inner mirror plate section 11, the inertial forces of the inertial elements 7 result in torques $M_1$ at the margin of the inner section 11 (dashed circle in FIG. 2 at the very top). These coupled torques additionally induce bending moments in the mirror plate 1 in the section 11 close to the center which counter the bending moments of the mirror plate 11 close to the center generated by the inertia-induced dynamic deformation. The inertia-induced dynamic deformation of the mirror plate 1 is thereby reduced; it is thus pulled straight so-to-say.

In the example shown, the section 11 of the mirror plate 1 close to the center and the additionally attached inertial elements 7 have the same thickness (perpendicular to the translation mirror plane) and are made from the same material. It is, however, also generally possible (see following examples) that the structure heights of the inner mirror plate section 11, of the inertial elements 7 and/or of the holding elements 2 are of different designs and/or that individual regions or complete regions of the mirror plate section 11 close to the center, of the inertial elements 7 and/or of the holding elements 2 comprise different materials.

Amorphous, monocrystalline or polycrystalline silicon, silicon oxide, aluminum, aluminum oxide, aluminum nitride, titanium, titanium aluminide or titanium oxide or also other semiconductor compatible materials in the thickness range from 10 nm to 500 μm can e.g. be used.

The above-described embodiment shows a total of four holding elements 2; it is, however, generally also sufficient for holding the mirror plate 1 in the frame structure 3 or for the restricted deflection of this mirror plate 1 perpendicular to the translation mirror plane 1 and relative to the frame structure 3 to provide two holding elements 2 arranged oppositely at the outer margin of the inner mirror plate region (dashed line).

Figure 3:
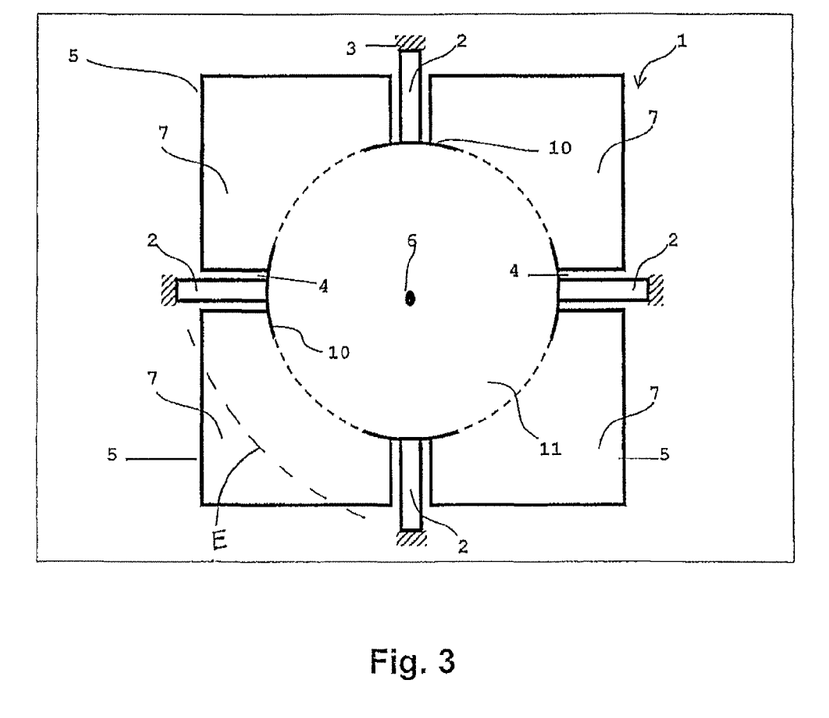
FIGS. 3 to 8 further embodiments for the present invention with simply structured base structures or sections of the mirror plate close to the center.

FIG. 3 shows a further embodiment which generally has the same structure as the embodiment shown in FIG. 2 so that only the differences will be described here. The mirror plate 1 has respective slits 10 which neighbor and are adjacent to the connection regions 4 between the holding elements 2 and the mirror plate 1 and which are introduced between the outwardly disposed sections 7 of the mirror plate 1 or between the inertial elements 7 and the section 11 of the mirror plate 1 close to the center along sections of the outer margin of the section 11 of the mirror plate 1 close to the center.

The inertial elements 7 are thus not fastened over the total periphery of the inner mirror plate section 11 to the latter (when the connection region between the holding elements and the mirror plate 1 is initially neglected), but rather the sections of the fastening outwardly disposed viewed with respect to the center of the inertial elements 7 (cf. in this respect reference numeral 8 in FIG. 2) or close to the holding elements are reach replaced with slot sections. The inertia-induced deformation is hereby further reduced in comparison with the case shown in FIG. 2.

Figure 4:
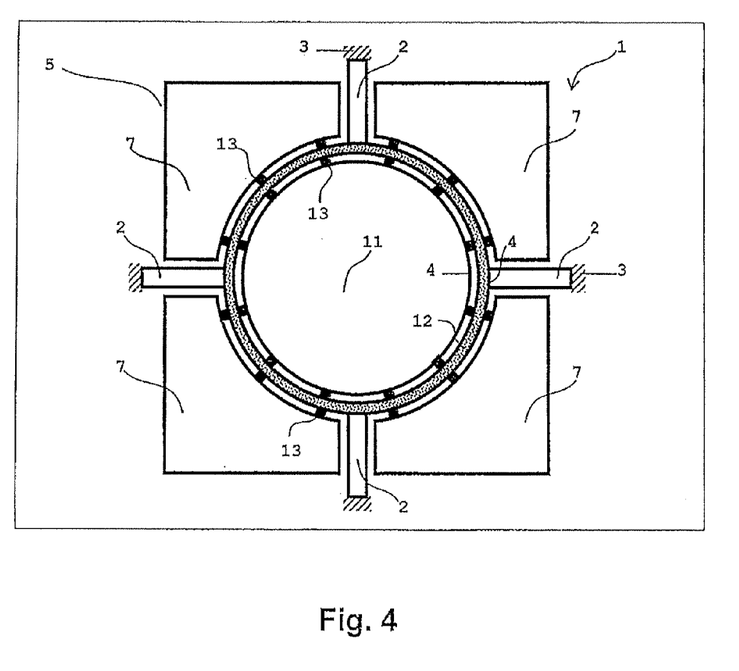

FIG. 4 shows a further embodiment which has a similar configuration to that shown in FIG. 2 so that only the differences are likewise described here. The section 11 close to the center is connected to the inertial elements 7 via an offset, ring-shaped frame element 12. The inertial elements 7 are thus not formed in one piece with the section 11 close to the center, but are rather connected offset therefore via the frame element 12 to the section 11 close to the center. This connection is made via connection pieces 13 arranged at regular intervals over the total periphery at the outer peripheral side of the section 11 close to the center or at the inner peripheral side of the inertial elements 7. The connection pieces 13 arranged at the outer peripheral side of the frame element 12 thus connect the frame element 12 to the inertial elements 7; the connection pieces 13 arranged at the inner peripheral side of the frame, element 12 connect the frame element 12 to the section 11 of the mirror plate 1 close to the center arranged in the interior of the frame element 12. The holding elements 2 are fastened in the connection region 4 between the inertial elements 7 in each case with their inwardly disposed end (i.e. their end facing the center 6) to the ring-shaped frame element 12. They thus hold the elements 7 and 11 of the mirror plate 1 via the frame element 12 and the connection pieces 13.

In the case shown, the inertial elements 7 thus form the connection pieces 13, the ring-shaped frame element 12 and the section 11 of the mirror plate 1 close to the center. The inertial elements 7 are connected with the aid of the connection pieces 13 via the ring-shaped frame element 12 to the section 11 of the mirror plate 1 close to the center. This has the advantage that the bending moment $M_1$ (cf. FIG. 2) coupled locally by the inertial elements 7 can be distributed more evenly in the mirror plate. In addition, the influence of the holding elements 2 on the deformation of the mirror plate 1 is reduced and the mirror plate is partly mechanically decoupled from the holding element. The number and the position of the connection pieces 13 can be of variable design. The connection pieces 13 (disposed inwardly or outwardly with respect to the ring-shaped frame element 12) can also be called a "distributed holding element" in cooperation with this frame element 12.

The basic principle of the present invention outlined in FIGS. 2-4, in particular has the following advantages with respect to the micromechanical mirror arrangements known from the prior art:

The principle in accordance with the invention allows the reduction of the dynamic deformation of micromirrors moved in translation absolutely and as regards both the mean value of the deformation and the so-called peak-to-valley value (that is: maxima to minima) of the deformation.

The principle in accordance with the invention optimizes the dynamic deformation profile especially in the region of the middle 11 of the mirror close to the center where the demands on the planarity are the highest. This in particular comes about in that micromirrors are frequently used for deflecting intensity profiles of the irradiated laser light of an approximate Gaussian distribution, whereby the deformation of the middle 11 of the mirror has a greater influence on aberrations and resolution limits than the deformation at the margin of the mirror.

The principle in accordance with the invention presented also works without any structuring of the mirror plate 1 with additional reinforcement structures on the front side or rear side 14, 15 (cf. the following), without any additional thinning of the region of the mirror plate 1 close to the center and without any increase in the thickness of the total mirror plate 1. This in particular has the advantage that the micromechanical mirror arrangements in accordance with the invention can be manufactured technologically without any increased effort.

FIGS. 5-8 show further embodiments in accordance with the invention; the configuration is here generally as shown in FIG. 2; the individual Figures show front projections onto a plane perpendicular to the translation mirror plane which extends along the longitudinal axis of two holding elements 2 arranged opposite one another.

It was assumed in the embodiments of FIGS. 2-4 that the mirror plate 1 or the elements 7, 11 are designed with one and the same structural height (extent perpendicular to the translation mirror plant, called D in the following). The translation mirror plane is, for example, the so-called device plane (SOI layer=semiconductor on insulator) of a BSOI wafer or similar, e.g. mechanically functional layers grown on epitactically, evaporated on and deposited with the aid of CVD or PDV processes.

The now described embodiments with different structural heights D can be realized with the aid of additional etching steps.

FIG. 5a shows an embodiment in which the thickness or the height of the section 11 of the mirror plate 1 close to the center (thickness D1) is half the size of the thickness D2 of the sections 7 close to the outer margin or of the inertial elements 7 of the mirror plate 1. The holding elements 2 are produced with identical thickness D2 to the inertial elements 7.

FIG. 5b shows a further embodiment which is formed as shown in FIG. 5a, with the only difference that the thickness of the holding elements 2 here corresponds to the thickness D1 of the section 11 close to the center.

FIG. 5c shows a further embodiment in which the inertial elements 7, the holding elements 2 and the section 11 close to the center are formed with one and the same thickness D and the inertial sections 7 on the lower side 15 of the mirror plate 1 have additional inertial sections 16 or inertial bodies 16. Alternatively to this (not shown here), the additional inertial sections 16 can also be formed on the upper side 14 of the mirror plate 1 or both on the upper side 14 and on the lower side 15 of the mirror plate 1.

FIG. 5d shows a case similar to that shown in FIG. 5c, with the section 11 of the mirror plate 1 close to the center, however, (as the only difference) having been thinned down by about two thirds with respect to the inertial elements 7 and the holding elements 2.

FIG. 5e shows a further case in which the holding elements 2 have been thinned down to about a third instead of the sections 11 close to the center (cf. FIG. 5d).

The elevation of the inertial elements 7 or their inertial mass can be realized by inertial sections 16 in the form of an additionally structured layer. This layer can, for example, be worked out of the volume of a substrate (e.g. of the bulk silicon used for the mirror plate 1) with the aid of suitable etching processes (e.g. DRIE).

Figure 6:
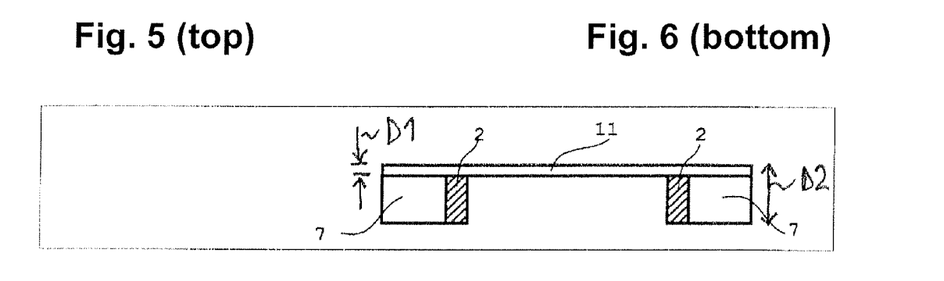

The mirror plate 1 can be produced monolithically from a material (material of the so-called device plane); it is, however, also possible to realize the mirror plate from an additionally applied layer (for example a thin film with or without tensile stress). FIG. 6 shows such an embodiment (i.e. the bulk material here only forms the inertial elements 7 and the holding elements 2, with the first being arranged on said thin film and forming the mirror plate together with this thin film). A combination with the additional inertial sections 16 is generally also possible here (not shown).

Figure 5:
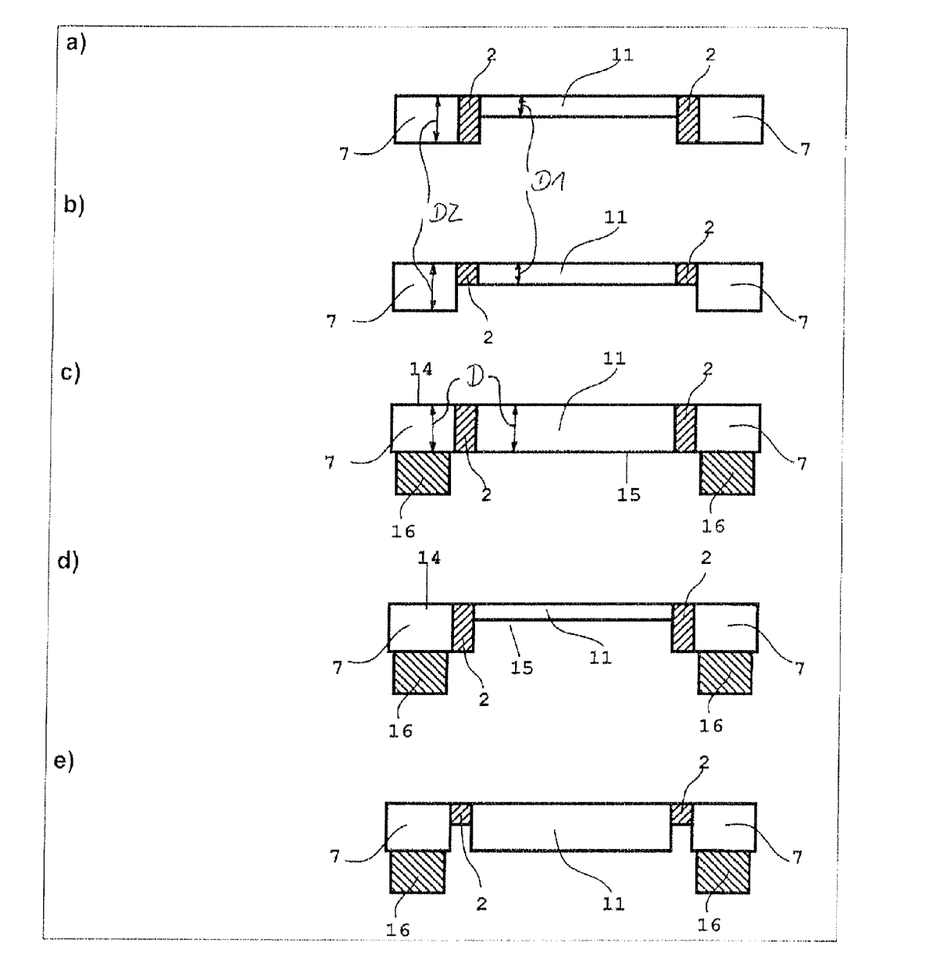
Figure 7:
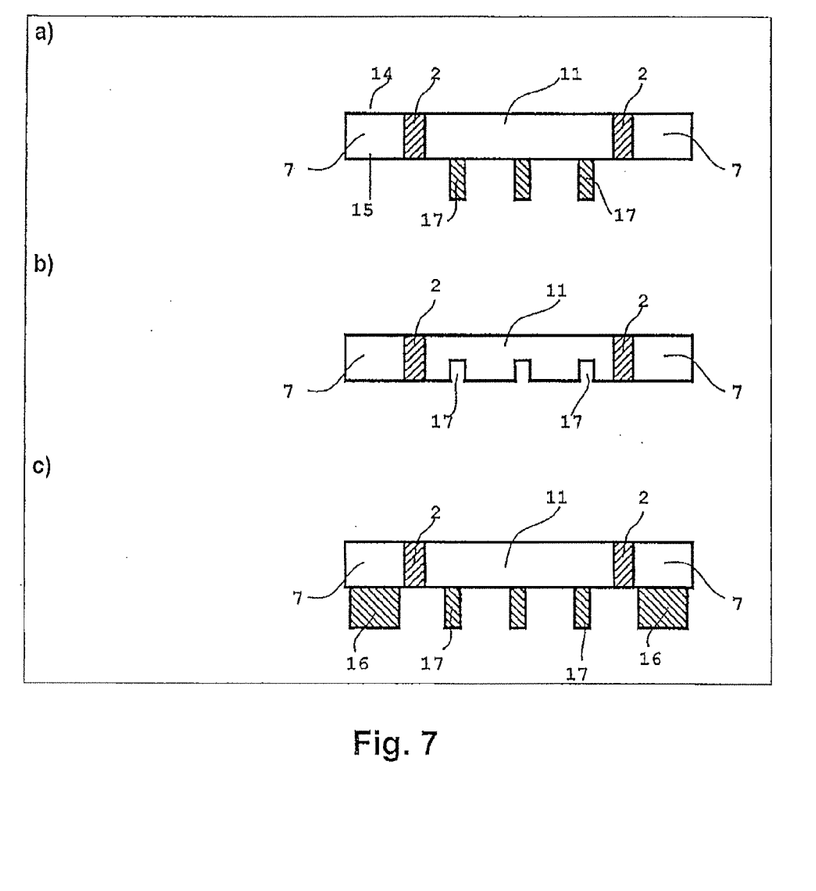

FIG. 7 shows three further embodiments in accordance with the invention, equally in the front projection view as in FIGS. 5 and 6.

In the embodiments of FIGS. 5 and 6, the section 11 of the mirror plate 1 close to the center, the inertial elements 7 and/or the holding elements 2 as a whole were thinned out or made thicker than adjacent elements. Alternatively to this or also in combination herewith, it is possible to minimize the dynamic deformation of the mirror plate 1 in accordance with the invention or of the inner section 11 in combination with the inertial elements 7 and a rear side stiffening structure or a surface stiffening structure 17. This has the advantage that the mirror plate 1 can be made thinner sectionally (in particular with respect to its central section 11) and the total mass of the mirror plate 1 can thus be reduced. A reduced overall mass is desirable with respect to the shock resistance of the micromirror.

FIG. 7a shows an example in which rib-like stiffening structures 17 are attached to the rear side 15 of the central section 11. These surface stiffening structures 17, which are here designed as beam-like ribs projecting beyond the lower surface 15 and arranged parallel to one another and spaced apart from one another, can be made by an additionally structured layer in a similar manner to the additional inertial elements 16 (see FIGS. 5 and 6). This layer can, for example, be worked out of the volume of a substrate (e.g. bulk silicon) with the aid of suitable etching processes. The lateral geometry of the surface stiffening structure 17 can be designed as desired. Instead of single ribs extending parallel to one another, a honeycomb-like surface stiffening structure can also be formed.

FIG. 7b shows an embodiment which is generally designed as in FIG. 7a; but in this case, the surface stiffening structure 17 is formed as a stiffening structure let into the lower side 15 (here: a plurality of recesses in the form of straight trenches extending parallel to one another and spaced apart from one another). The rear side structure 17 is thus integrated into the functional layer of the component 11 here.

FIG. 7c shows an embodiment in which the surface stiffening structure 17 of the case shown in FIG. 7a is realized in combination with the additional inertial sections 16 as described with respect to FIG. 5.

The additional inertial sections 16 and/or the surface stiffening structures 17 can, of course, be realized almost as desired with those variations of the thickness shown in FIG. 5.

Figure 8:
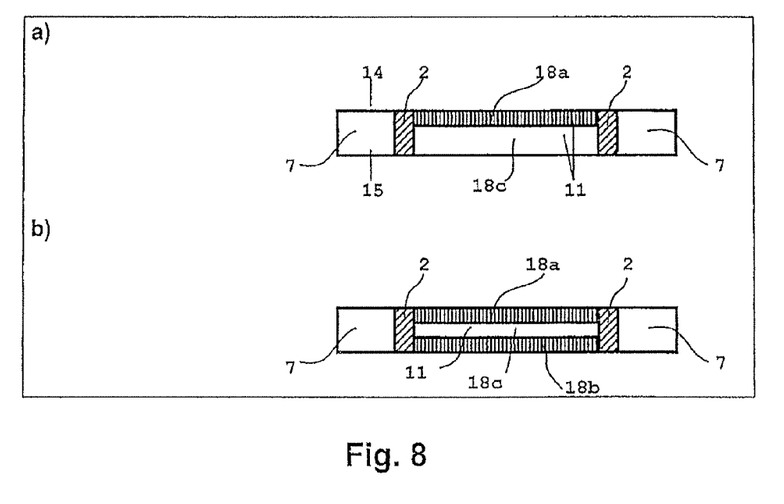

FIG. 8 shows two cases in which the section 11 of the mirror plate 1 close to the center is made in multiple layers, with at least one of the plurality of layers being formed as a tensioned layer.

In FIG. 8a, the section 11 close to the center is made with two layers, with the upper layer 18a facing the upper side 14 being formed as a tensioned layer and the lower layer 18c facing the lower side 15 being formed as a non-tensioned layer. FIG. 8b shows a three-layer design in which the section 11 close to the center is formed as a sandwich structure whose upper layer 18a facing the upper side 14 and whose lower layer 18b arranged facing the lower side 15 are respectively tensioned and whose middle layer 18c is formed in a non-tensioned manner between the two layers 18a and 18b.

In the cases shown, the central section 11 of the mirror plate is thus stiffened with the aid of tensile stresses to further reduce the dynamic deformation. Such (internal) tension can be set with the aid of suitable process parameter controls in the manufacturing methods (in PVD processes, in CVD processes, in epitaxial processes or in evaporation processes) of the functional layer or of the mirror plate 1. The procedure in this respect is familiar to the skilled person. Such tensioned layer systems can naturally be combined with additional inertial sections 16, surface stiffening structures 17 or thinned portions as described above.

SOI layers are frequently used as the mechanical functional layer or for the mirror plate layer 1 for micromechanically produced translation mirrors of some dozen micrometers thickness. The production of these structural thicknesses with the aid of thin film technology (e.g. epitaxy, CVD, PVD) is very time-consuming and usually not desirable. Since the SOI (monocrystalline silicon) is present free of tension, a tensile stress can as a rule only be introduced with the aid of additional thin films into the mirror plate 1. FIG. 8 shows possible combinations of mirror plate central sections 11 tensioned with the aid of additional thin films 18a, 18b with the inertial elements 7. If the tensioned layers 18a, 18b are only applied to one side of the mirror plate (FIG. 8a), a static curvature of the mirror plate is obtained. On attachment at both sides (FIG. 8b) or with symmetrical tensile stress, no initial static curvature arises.

The embodiments in accordance with FIGS. 5-8 in particular have the following advantages:

The effect (of the reduction of the dynamic deformation by the inertial masses) is further amplified; and/or The mass of the mirror plate can be reduced with the aid of an effect of equal magnitude in comparison with the monolithic mirror plate (which in turn has a positive effect on the shock resistance).

Figure 9:
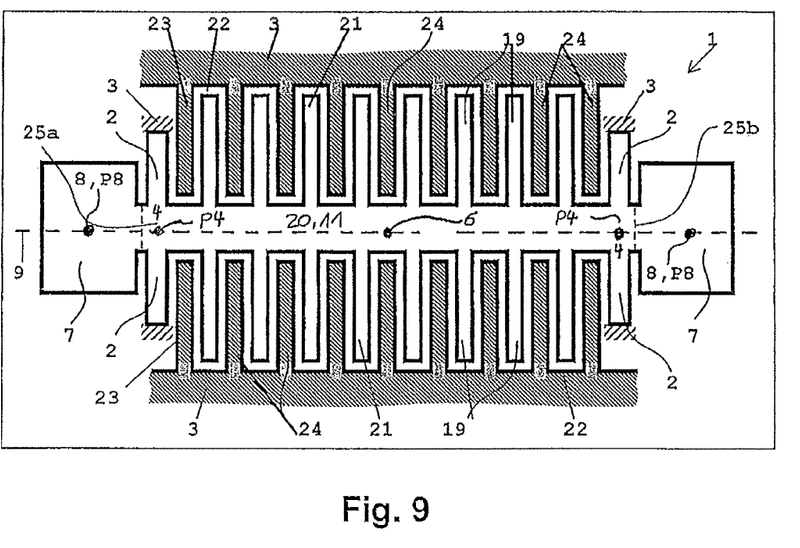
FIGS. 9 to 11 three further embodiments with sections close to the center or base structures of the mirror plate with a lamellar structure.
Figure 10:
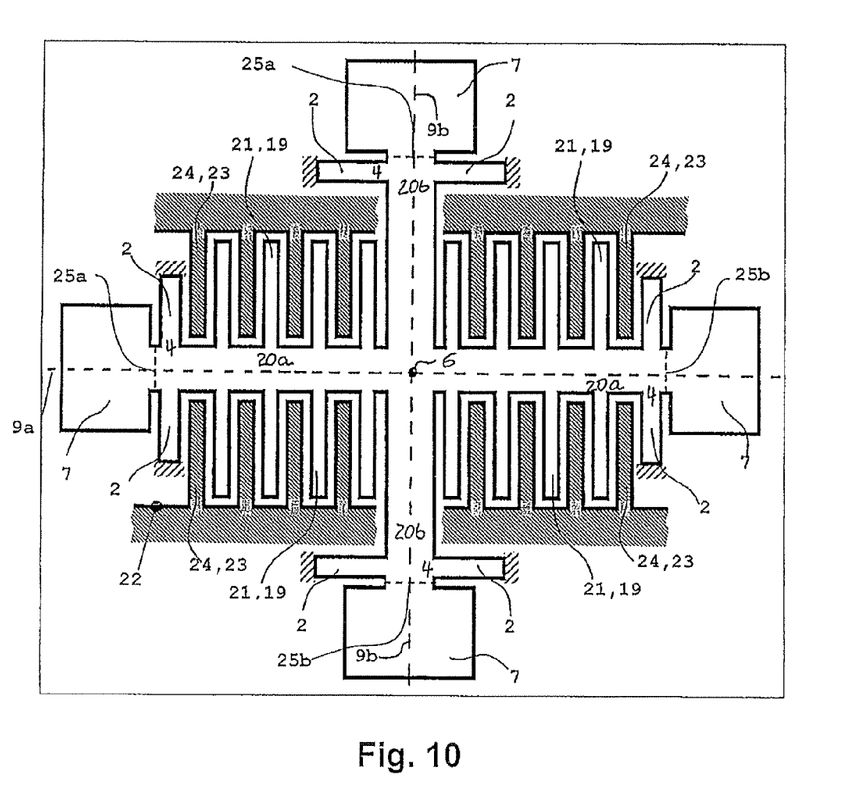
Figure 11:
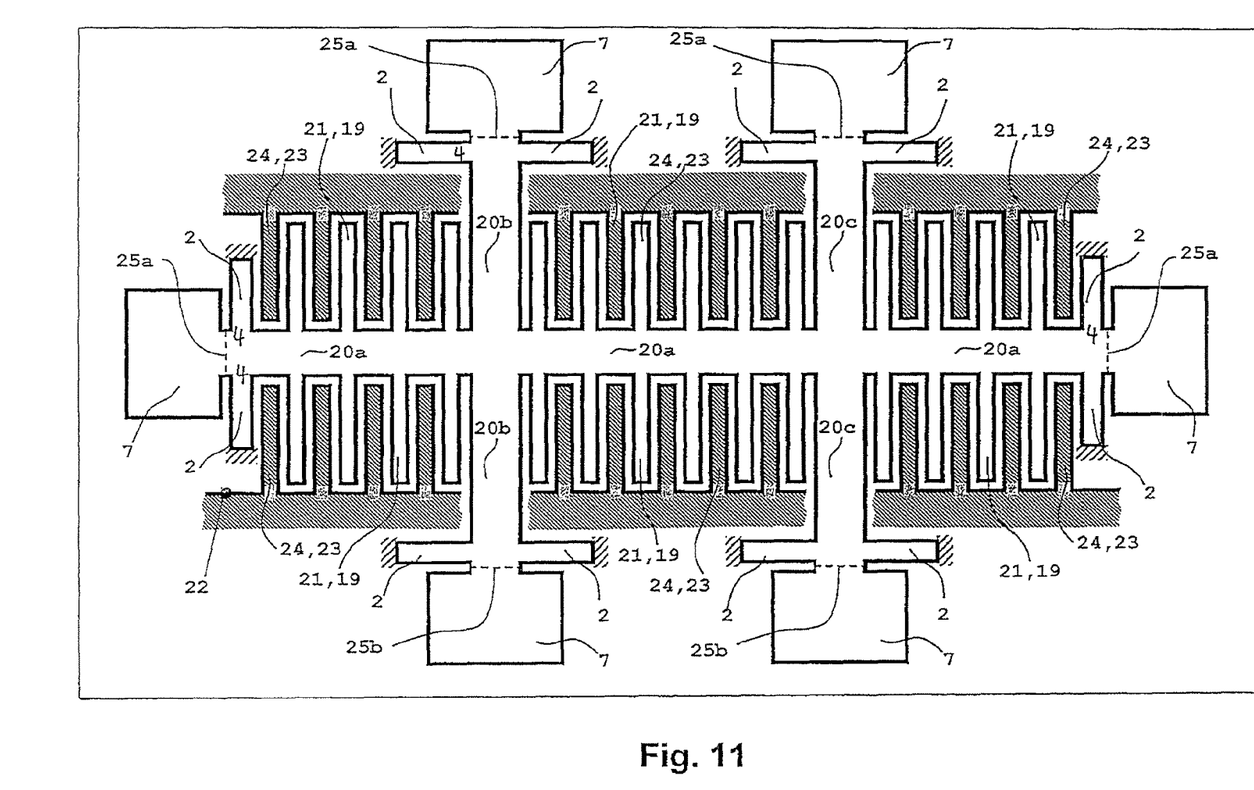

As the further three embodiments of FIGS. 9-11 show, the present invention can also be realized within the framework of lamella grids moved in translation which can in particular be used within a FTIR.

FIG. 9 shows a first such embodiment in which the mirror plate 1 is made as a lamella grid in the form of a comb structure 19. For this purpose, the mirror plate 1 has an elongated, straight beam 20 having a plurality of comb fingers 21 of the comb structure which project spaced apart from one another perpendicular to the longitudinal axis of the beam. The longitudinal axis of the beam 20 is designated by the reference numeral 9 here. The center of symmetry (center of point symmetry) of the beam 20, of the section 11 of the mirror plate 1 close to the center including it and also of the total mirror plate 1 (which includes the elements 7, 20 and 21 described in the following) in the translation mirror plane is designated by 6 as in the preceding embodiments.

The beam 20 has at its two ends 25a, 25b, seen along the longitudinal axis 9, a respective inertial element 7 which projects (seen with respect to the position of the holding elements 2, see the following). The formation of the mirror plate 1, of the holding elements 2 and of the frame structure 3 is made here such that, along the longitudinal axis 9 of the beam and viewed from the center 6 toward the outside to the two ends 25a, 25b of the beam 20, initially a beam section is formed having a plurality of comb fingers 21 projecting perpendicular to the longitudinal axis of the beam in the translation mirror plane and arranged parallel to one another and spaced apart from one another. A section adjoins this section having a plurality of projecting comb fingers 21 of the mirror plate 1 in which, viewed with respect to the longitudinal axis 9, a respective holding element 2 is formed which projects perpendicular at both sides of the longitudinal axis 9 (the beam 20 thus has two holding elements 2 toward each end). Finally, an inertial element 7 respectively projecting in the direction of the longitudinal axis 9 of the beam follows at the two outer ends 25a, 25b of the beam 20.

The arrangement of the outwardly disposed inertial elements 7, of the connection regions 4 of the holding elements 2 with the mirror plate 1 or with the beam 20 as well as of the center 6 of the mirror plate 1 is thus such that, on a perpendicular projection (in the translation mirror plane) of these elements onto the longitudinal axis 9, the center 8 of the inertial elements 7 (projection P8) comes to lie further away from the center 6 on the straight projection line 9 or on the longitudinal axis 9 of the beam than the projection of the centers of the holding elements 2 or of the connection regions 4 (projection location P4 on the longitudinal axis 9).

In the case shown, the frame structure 3 also has a plurality of comb fingers 23 of a comb structure 24 projecting perpendicular to the surface of the inner sides 22 and formed spaced apart from one another and parallel to one another on these inners side 22 facing the mirror plate 1. The comb fingers 23 of the comb structure 24 are formed and arranged with respect to the comb fingers 21 of the comb structure 19 of the mirror plate 1 offset to one another and intermittently engaging into one another (in the translation mirror plane). The comb structure 19 of the mirror plate 1 and the comb structure 24 of the frame structure 3 can additionally be utilized as an electrostatically operating comb drive.

FIG. 9 thus shows a schematic representation of a mirror plate 1 in the form of a lamella grid component having projecting inertial elements. This grid component substantially includes four functional elements. The lamella-like combs 21 which are provided with a mirror-coated layer are fastened to a beam-like structure 20. The beam-like structure 20 is connected to holding elements 2, or is fastened thereto, which can be considered as a joint or hinge. The holding elements are here bending beams, but can also be designed as meandering spring elements or as a pantographic suspension. The holding elements 2 are then fastened to the (non-movable) frame structure 3 which likewise has lamella-like combs 23 or a comb structure 24 engaging in the manner of a zip into the comb structure 19 of the mirror plate 1. A mirror-coated layer is also located on the comb elements 23 or on the comb structure 24. The lamella-like comb structures 19 and 24 form the optically effective surface and represent a lamella grid interferometer.

As described above, it is also possible to utilize the lamella-like combs as drive electrodes within an electrostatic scanner drive (comb drive). The beam-like structure 20 together with the inner lamella-like comb 19 are moved in translation out of the shown translation mirror plane or translation plane by application of a suitable AC voltage between the drive electrodes. Alternative drive mechanisms are, however, also conceivable.

The beam-like structure or the section 11 close to the center (together with the projecting fingers 21) also undergoes an inertia-induced dynamic deformation here which is also at a maximum at the center of the beam-like structure. Since, however, inertial elements 7 are provided at the two ends 25a, 25b of the beam structure which project over it (or over the holding elements 2 and the connection regions 4), the dynamic deformation of the beam-like structure can be reduced. Since the inner lamella-like comb 19 is fastened to the beam-like structure 20, the reduction of the dynamic deformation of the beam-like structure simultaneously also results in a reduction of the dynamic deformation of the inner lamella-like comb 19 and thus in an improved planarity of the optically effective surfaces of the lamella-like grid.

FIG. 10 shows a further embodiment which includes a mirror plate 1 formed as a simple crossbeam structure. The mirror plate 1 has two beam elements 20a, 20b which are arranged perpendicular to one another viewed with respect to their longitudinal axes, with the beam element 20a, as previously described (FIG. 9), having a plurality of comb fingers 21 of a comb structure 19 projecting perpendicular to the longitudinal axis 9a of the beam. The beam element 20b has no such comb fingers along its longitudinal axis.

In the case shown in FIG. 10, in each of the two beam structures, the respective holding elements 2 or the connection regions 4 are each (viewed with respect to the respective longitudinal axis of the beam), relative to the inertial elements 7, inwardly offset or arranged toward the center of the crossbeam structure 20a, 20b (here again designated by the reference numeral 6).

In the embodiment shown, a second beam-like element 20b is thus attached at the center of the first beam-like element 20a, with the second beam element 20b stiffening the center of the first beam element 20a and thus further reducing the dynamic deformation. Respective inertial elements 7 are arranged at the end side both at the first and at the second beam element, which not only results in a stiffening of the first beam element, but also in an active reduction of the dynamic deformation of the two beam elements 20a, 20b and thus of the lamella grid.

FIG. 11 shows a further embodiment with a double crossbeam as a mirror plate 1: The mirror plate 1 thus has a first beam 20a and two further second beams 20b, 20c arranged spaced apart from one another and parallel to one another, with the first beam 20a being arranged perpendicular to the two beams 20b, 20c, and with the first beam 20a being provided with a plurality of comb fingers 21 of a comb structure 19 projecting perpendicular to the longitudinal axis of the beam (not shown here). The oppositely disposed structure of the frame structure 3 is here (as also in the case shown in FIG. 10) likewise also formed as a comb structure 24 having individual fingers 23. The two comb structures 19 and 24 engage intermittently with one another, as described for FIG. 9.

FIG. 11 thus shows that the basic idea shown in FIG. 10 (crossbeams) can also be used a multiple of times to reduce the dynamic deformation. As many orthogonal additional beams as desired (without comb fingers) are thus possible.

The invention claimed is:
1. A micromechanical mirror arrangement comprising
a mirror plate (1) formed as a translation mirror and connected by at least two holding elements (2) to a frame structure (3), said mirror plate movable in translation relative to this frame structure and arranged to reduce dynamic deformation of said mirror plate during the translation movement, the mirror arrangement comprising, said holding elements (2) connected to the mirror plate (1) at a connection region (4) which is arranged inwardly offset viewed from an outer margin (5) of the mirror plate toward the center (6) of the mirror plate; said mirror plate (1) having inertial elements (7) which are arranged point-symmetrically to the center (6) of the mirror plate (1) and which project outwardly with respect to at least one connection region (4) of a holding element (2) with the mirror plate (1) viewed from the center (6) of the mirror plate (1) toward the outside.

2. A micromechanical mirror arrangement in accordance with claim 1, wherein the mean distance (E) of the outer margin (5) of the mirror plate (1) from its center (6) is greater than the spacing of the connection regions (4) of the holding elements (2) of the mirror plate (1) from this center (6).

3. A micromechanical mirror arrangement in accordance with claim 1, wherein the inertial elements (7) are arranged such that the perpendicular projection (P8) of the center (8) of these inertial elements (7) to a straight line (9) extending through the center (6) of the mirror plate (1) is further away from the center (6) of the mirror plate (1) than the perpendicular projection (P4) of the connection regions (4) of a holding element (2) with the mirror plate (1).

4. A micromechanical mirror arrangement in accordance with claim 1, further comprising a slot (10) arranged adjacent to at least one connection region (4) between the holding element (2) and the mirror plate (1) and is introduced, viewed from the outer margin (5) of the mirror plate inwardly to its center (6).

5. A micromechanical mirror arrangement in accordance with claim 1, wherein a section (11) of the mirror plate close to the center is connected to the inertial elements (7) of the mirror plate (1) via an offset frame element (12), with the frame element (12) being provided on its side facing the center (6) and on its side remote from the center (6), with a plurality of connection pieces (13) and that the frame element (12) is connected both to the section (11) close to the center and to the inertial elements (7).

6. A micromechanical mirror arrangement in accordance with claim 1, wherein said mirror plate (1) has a uniform thickness (D) viewed perpendicular to its plate plane between 10 nm and 500 μm.

7. A micromechanical mirror arrangement in accordance with claim 1, wherein said mirror plate (1) has sectionally different thicknesses (D1, D2), viewed perpendicular to its plate plane, with at least one of these thicknesses (D1, D2) being between 10 nm and 500 μm.

8. A micromechanical mirror arrangement in accordance with claim 1, wherein a section (11) of the mirror plate (1) facing the center (6) has a first thickness (D1) and the inertial elements (7) of the mirror plate have a second thickness (D2), with the first thickness (D1) being smaller than the second thickness (D2).

9. A micromechanical mirror arrangement in accordance with claim 1, wherein at least one of the holding elements (2) has the same thickness, viewed perpendicular to the plate plane of the mirror plate (1), as the inertial elements (7) of the mirror plate (1).

10. A micromechanical mirror arrangement in accordance with claim 1, wherein the inertial elements (7) of the mirror plate (1), viewed in the direction perpendicular to the plate plane of the mirror plate (1), have at least one additional inertial section (16) on at least one of the upper side and lower side (15).

11. A micromechanical mirror arrangement in accordance with claim 1, wherein a section (11) of the mirror plate (1) close to the center has at least one surface stiffening structure (17) on at least one of its upper side (14) and lower side (15).

12. A micromechanical mirror arrangement in accordance with claim 11, wherein the surface stiffening structure (17) is formed as a recess into at least one of the upper side (14) and lower side (15).

13. A micromechanical mirror arrangement in accordance with claim 1, wherein at least one section of the mirror plate (1) is a multilayer plate.

14. A micromechanical mirror arrangement in accordance with claim 13, wherein tensile stress is realized, viewed perpendicular to the plate plane of the mirror plate, on said multilayer plate.

15. A micromechanical mirror arrangement in accordance with claim 1, wherein said mirror plate (1) is formed with a lamella grid comb structure (19).

16. A micromechanical mirror arrangement in accordance with claim 15, wherein said comb structure (19) of the mirror plate (1) is formed as a comb drive.

17. A micromechanical mirror arrangement in accordance with claim 15, wherein the lamella grid is formed as an electrostatically, electromagnetically, piezoelectrically, piezomagnetically, electrostrictively, magnetostrictively, thermally or pneumatically drivable lamella grid.

18. A micromechanical mirror arrangement in accordance with claim 1, wherein said mirror plate (1) includes two beams (20a, 20b) which are arranged perpendicular to one another and which are provided with a plurality of comb fingers (21) of a comb structure (19) projecting perpendicular to the respective longitudinal axis of the beams.

19. A micromechanical mirror arrangement in accordance with claim 18, wherein said mirror plate (1) has a first beam (20a) and two further second beams (20b, 20c) arranged spaced apart from one another and parallel to one another, with the first beam (20a) being arranged perpendicular to the two second beams (20b, 20c), and with at least one beam (20a, 20b, 20c) being provided with a plurality of comb fingers (21) of a comb structure (19) projecting perpendicular to the respective longitudinal axis of the beam.

20. A micromechanical mirror arrangement in accordance with claim 1, wherein the inertial elements (7) of the mirror plate (1) are formed from a first material and a section (11) of the mirror plate (1) close to the center is formed from a second material.

21. A micromechanical mirror arrangement in accordance with claim 20, wherein at least one of the first material and the second material comprises one of amorphous, monocrystalline or polycrystalline silicon, silicon oxide, aluminum, aluminum oxide, aluminum nitride, titanium, titanium aluminide or titanium oxide.

22. A micromechanical mirror arrangement in accordance with claim 1, wherein said mirror plate (1) is monolithic.

23. A micromechanical mirror arrangement in accordance with claim 1, wherein at least one inertial element (7) of the mirror plate (1) is not mirror-coated and a section (11) of the mirror plate (1) close to the center (11) is mirror-coated.

24. A micromechanical mirror arrangement in accordance with claim 1, wherein at least one inertial element (7) of the mirror plate (1) is mirror-coated and is formed as a comb structure and a section (11) of the mirror plate (6) close to the center (11) is mirror-coated.

25. A micromechanical mirror arrangement in accordance with claim 1, wherein said holding elements (2) are one of bending beams, as meandering or beam spring elements and as a pantographic suspension.

26. A micromechanical mirror arrangement in accordance with claim 1, wherein at least one section (11) of the mirror plate (1) close to the center is made as a round, elliptical, rectangular or square plate section.

27. A micromechanical mirror arrangement in accordance with claim 1, wherein at least one projecting inertial element (7) of the mirror plate (1) is arranged at both ends (25a, 25b) of at least one beam (20, 20a, 20b, 20c).

28. A micromechanical mirror arrangement in accordance with claim 1 within a Fourier transform spectrometer.

* * * * *